United States Patent [19]

Muscavage

[11] Patent Number: 5,268,656
[45] Date of Patent: Dec. 7, 1993

[54] PROGRAMMABLE CLOCK SKEW ADJUSTMENT CIRCUIT

[75] Inventor: Richard Muscavage, Gilbertsville, Pa.

[73] Assignee: AT&T Bell Laboratories, Murray Hill, N.J.

[21] Appl. No.: 971,785

[22] Filed: Nov. 5, 1992

[51] Int. Cl.⁵ .............................................. H03B 27/00
[52] U.S. Cl. ..................................... 331/45; 331/57; 331/74
[58] Field of Search ................... 331/2, 45, 49, 55, 57, 331/74, 172

[56] References Cited

U.S. PATENT DOCUMENTS

| | | | |
|---|---|---|---|
| 4,659,999 | 4/1987 | Motoyama et al. | 331/2 |
| 4,847,516 | 7/1989 | Fujita et al. | 331/2 X |
| 4,868,522 | 9/1989 | Popat et al. | 331/55 X |
| 5,083,299 | 1/1992 | Schwanke et al. | 331/57 X |
| 5,126,691 | 6/1992 | Mijuskovic et al. | 331/1 A |

OTHER PUBLICATIONS

D. Burksky, "Unsurpassed Flexibility Heralds Clock Generator," *Electronic Design*, Nov. 12, 1992, pp. 7-2-3-7-35.

Product Brief, Bipolar Integrated Technology, Inc., B4101,B4103,B4105,B4201,B4203,B4205 Low Skew Clock Drivers and Output Clock Generators, 1992.

"PLL clock generators bow," *EETimes*, Jun. 8, 1992, R. Wilson.

*Primary Examiner*—David Mis
*Attorney, Agent, or Firm*—David L. Smith

[57] ABSTRACT

An integrated circuit has an oscillator for generating a plurality of phases of an oscillator clock signal. Each phase of the oscillator clock clocks a respective one of a plurality of ring shift registers. The output of each stage of the ring shift registers is a phase of a desired clock signal and is an input to a multiplexer that can selectively provide one of the desired clock phases as the output of the multiplexer. In another embodiment of the invention the ring shift registers generate half of the phases of a desired clock signal at a multiple of the desired frequency. The multiplexer output clocks a divide by two circuit which is followed by another level of multiplexing to generate the other half of the phases and to divide down to the desired frequency.

23 Claims, 5 Drawing Sheets

PROGRAMMABLE CLOCK SKEW ADJUSTMENT CIRCUIT

TECHNICAL FIELD

This invention relates generally to integrated circuits for controlling clock skew and particularly to integrated circuits with a programmable clock skew adjustment circuit.

BACKGROUND OF THE INVENTION

As the clock frequency increases at which integrated circuits, including microprocessor-based systems, operate, the clock period decreases such that there is less time available to accommodate board trace propagation delays in the clock signal. A high frequency clock signal is typically generated by a clock generation circuit using a low frequency crystal as an input reference clock signal. The clock generation circuit includes a frequency synthesizer to produce the high frequency clock signal output. The high frequency clock signal is routed through traces on a circuit board to devices such as a cache controller, processors, and random access memories. It is desirable to have clock signals arrive at all devices at precisely controlled times, which may be may not be simultaneous. The devices receiving the clock signal are located at various distances from the clock generation circuit resulting in traces of different length over which the clock signal must propagate. Differences in clock signal arrival time at various devices due to propagation delays, called clock skew, can be reduced but typically not eliminated by board layout. Furthermore, it is desirable to lay out a board efficiently to package as many components as possible into a given area with concerns over clock signal propagation delays addressed in another manner.

One solution to the clock propagation delay has been to provide a delay line clocked at a very high frequency. The output of the delay line is tapped at the number of delay elements through which it is desirable to propagate to obtain an appropriate delay. Additional resolution can be obtained by dividing down the tapped output to the desired frequency.

U.S. Pat. No. 5,126,691 discloses a similar solution in which a delay line is clocked at a very high frequency. The outputs of each stage in the delay are coupled to a multiplexer circuit that provides as an output the output, or the inverse of the output, of any of the delay stages. The output of the multiplexer is divided down to a desired frequency.

Delay line counter systems suffer from the drawback that delay line counters are inherently nonsymmetrical in propagation delay because the delay at each stage in the delay line is dependent on all previous stages. The higher a count, the greater the variation in delay relative to lower count delays. Furthermore, the increment of adjustment is limited to be multiples of the delay of each stage, as divided down by any counters. The delay is not dependent on the frequency but is the amount of time necessary for an input to propagate through the delay line.

SUMMARY OF THE INVENTION

In accordance with an embodiment of the present invention, an integrated circuit has an oscillator for generating a plurality of phases of an oscillator clock signal. Each phase of the oscillator clock controls a respective one of a plurality of ring shift registers. The output of each stage of the ring shift registers is a phase of a desired clock signal and is an input to a multiplexer that can selectively provide one of the desired clock phases as the output of the multiplexer. In another embodiment of the invention the ring shift registers generate half of the phases of a desired clock signal at a multiple of the desired frequency. The multiplexer output clocks a divide by two circuit which is followed by another level of multiplexing to generate the other half of the phases and to divide down to the desired frequency.

DETAILED DESCRIPTION

Figure 1:
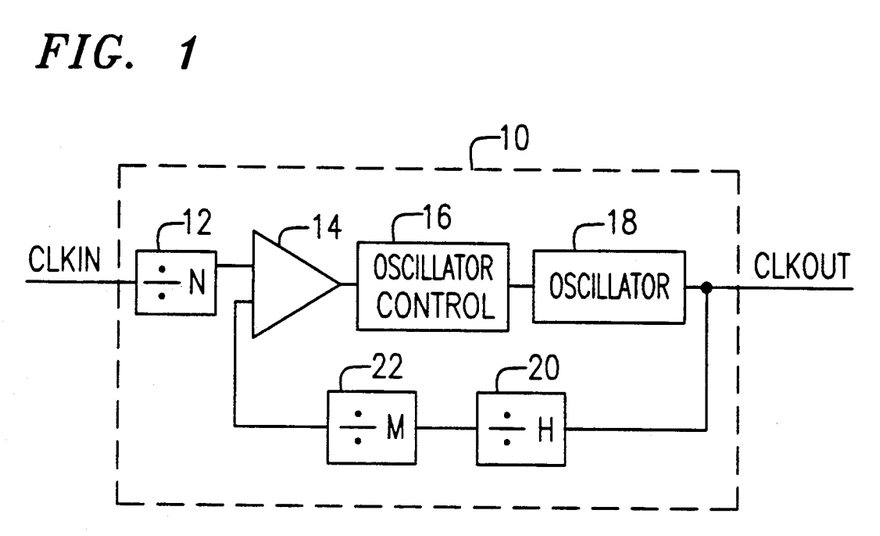
FIG. 1 is a schematic diagram illustrating a frequency synthesizer phase-locked loop clock generating circuit.

Referring to FIG. 1, a schematic diagram illustrating a frequency synthesizer phase-locked loop clock generation circuit 10 is shown. Clock generation circuit 10 receives a reference clock signal CLKIN of frequency FIN as an input and generates an oscillator clock signal CLKOUT at a frequency FOUT as an input and generates an oscillator clock signal CLKOUT at a frequency FOUT as an output. The frequency of oscillator clock signal CLKOUT is higher than FIN and is programmable by setting parameters M and N. The reference clock signal CLKIN is coupled to the input of divide by N counter 12. The output of divide by N counter 12 is coupled to phase detector 14 as a first input. The output of phase detector 14 is coupled to the input of oscillator control 16. The output of oscillator control 16 is coupled to the input of oscillator 18. The output of oscillator 18 is the oscillator clock signal. The frequency of the oscillator clock signal is a multiple, H, of the frequency of a desired or programmed clock signal selected by a user. The oscillator output is coupled to the clock input of divide by H counter 20. The output of divide by H counter 20 provides an output at the same frequency as the desired or programmed clock signal. The output of the divide by H counter is coupled to the clock input of divide M counter 22. The output of divide by M counter 22 is coupled as the second input to phase detector 14. The frequency of CLKOUT is (H×M)/N multiplied times the frequency of CLKIN, where M and N are user defined variables and H is the multiple of the oscillator clock signal frequency to the frequency of a desired or programmed clock signal, selected by the user. The desired clock signal is generated to clock devices on a circuit board on which the integrated circuit containing the clock skew adjustment circuit is mounted.

Figure 2:
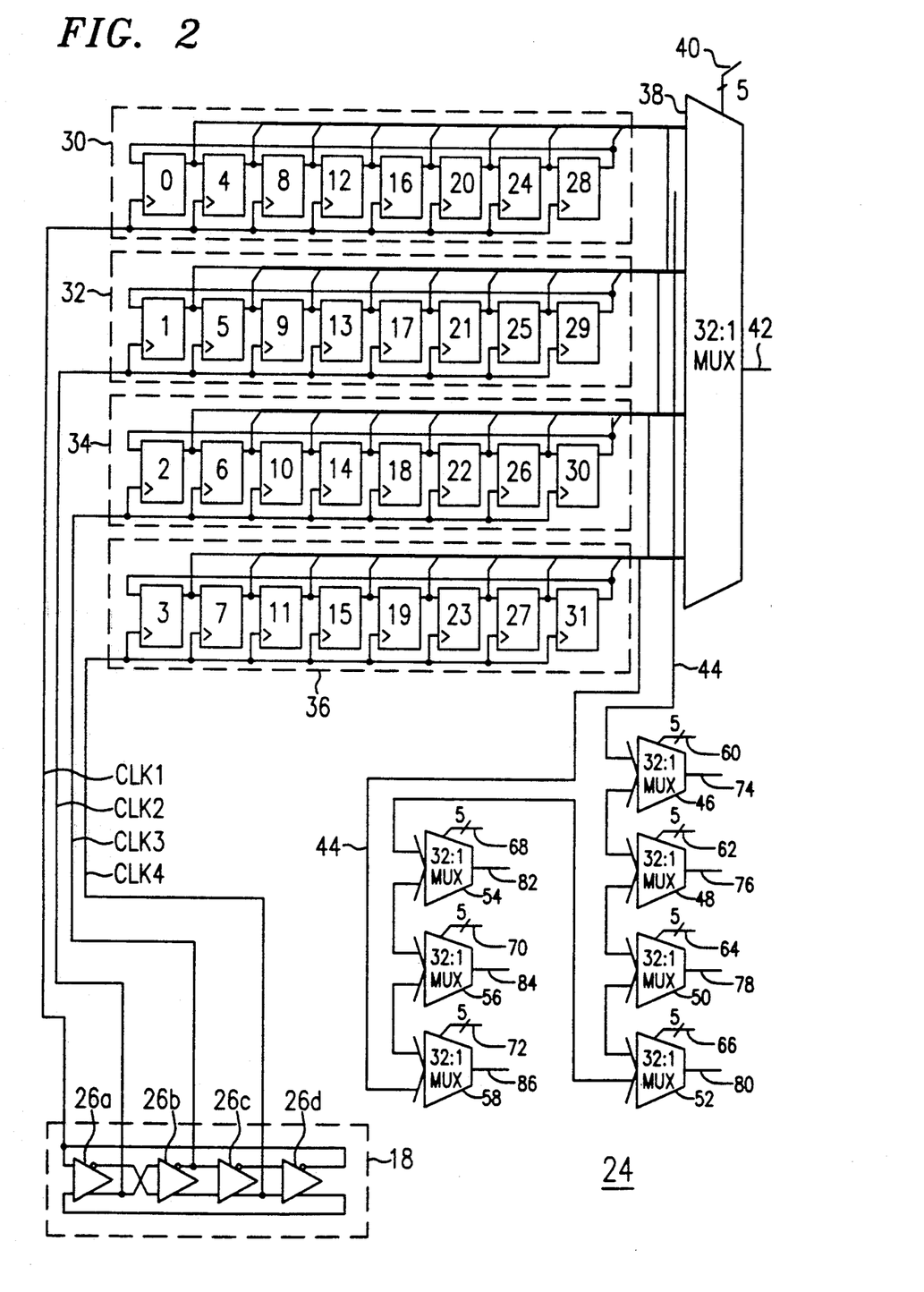
FIG. 2 is a schematic diagram illustrating a programmable clock skew adjustment circuit.

FIG. 2 is a schematic diagram illustrating a programmable clock skew adjustment circuit 24. Oscillator 18 is illustrated in greater detail as a multiple stage oscillator in which the stages 26a-d are substantially identical.

Figure 3:
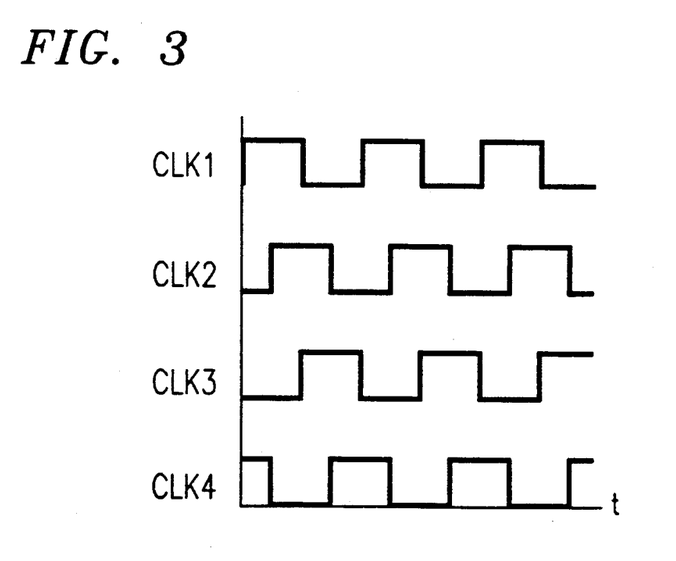
FIG. 3 is a graphical diagram illustrating phases of an oscillator clock signal equally spaced over the oscillator clock period.

The oscillator frequency may be voltage or current controlled as is known in the art. Outputs are tapped off of selected ones of the stages 26a-d of oscillator 18 to provide a plurality of phases of the oscillator clock signal. The number of oscillator clock phases generated is dependent on the configuration of the oscillator as well as the number and increment size of desired or programmed clock phases to be generated. A four-stage oscillator is illustrated in which each stage is tapped to provide quadrature oscillator clock phases CLK1, CLK2, CLK3 and CLK4. The oscillator clock phases are illustrated in FIG. 3.

Each oscillator stage 26a-d output provides a respective quadrature oscillator clock phase as a clock signal to each of a plurality of ring counters or ring shift registers 30, 32, 34 and 36. The output of stage 26d, CLK1, is the clock signal for multiple stage ring shift register 30. The output of stage 26a, CLK2, is the clock signal for multiple stage ring shift register 32. Similarly, the output of stages 26b and 26c, respectively CLK3 and CLK4, are the clock signals for multiple stage ring shift registers 34 and 36, respectively.

Each stage of the multiple stage ring shift register 30, 32, 34 and 36 is preset upon powering up and is designated by a number. Each stage is clocked by the respective oscillator clock phase signal for the multiple stage ring shift register. The sequence of clocking the ring shift registers is determined by the counter preset. Each stage receives as an input the output of the preceding stage and provides an output coupled to both the input of multiplexer 38 and the input of the next succeeding stage of the multiple stage ring shift register. Ring shift registers 30, 32, 34 and 36 are illustrated as having eight stages. Flip flop 0 receives as inputs the oscillator clock phase signal, CLK1, of ring shift register 30 and the output of flip flop 28. The output of flip flop 0 is coupled both to the next stage of the ring shift register, flip flop 4, and to multiplexer 38. Each stage of the ring shift register may be substantially identical. Many types of devices can provide the desired function of each stage of the ring shift register. In a preferred embodiment, differential flip flops are used.

Ring shift register 32 is identical to ring shift register 30 with each stage clocked by oscillator clock phase CLK2. Ring shift registers 34 and 36 are also identical to ring shift register 30 and are clocked respectively by oscillator clock phases CLK3 and CLK4. The output of each stage of ring shift registers 30, 32 34 and 36 are coupled as inputs to multiplexer 38. In the illustrative embodiment there are 32 outputs that are coupled as inputs to multiplexer 38. Multiplexer 38 is controlled by a plurality of control signals 40 to select one of the inputs as the output 42. In the illustrative embodiment, there are a total of 32 stages in the ring shift registers. Concomitantly multiplexer 38 is a 32:1 multiplexer with five select input bits to select the output. The output of each stage of ring shift registers 30, 32, 34 and 36 collectively form bus 44 which may be coupled to other multiplexers as inputs. Seven additional 32:1 multiplexers 46, 48, 50, 52, 54, 56 and 58 are illustrated, each respectively with five select input bits of control 60, 62, 64, 66, 68, 70 and 72 to independently select one of the outputs from a stage of a ring shift register available on bus 44 as the respective output 74, 76, 78, 80, 82, 84 and 86.

Figure 5:
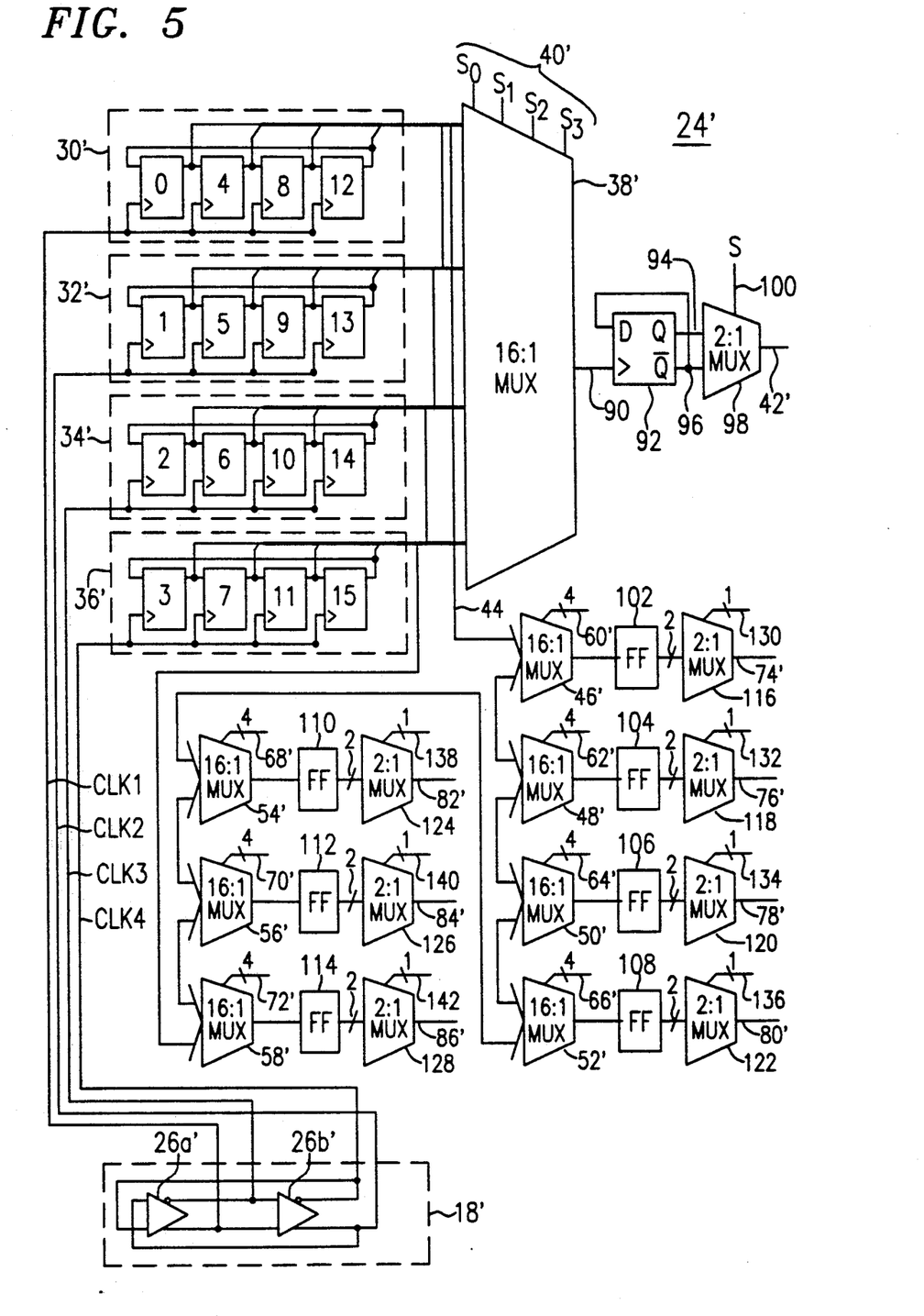
FIG. 5 is a schematic diagram illustrating an alternate embodiment of a programmable clock skew adjustment circuit.

An alternative embodiment programmable clock skew adjustment circuit 24' is shown schematically in FIG. 5. Circuit 24' is preferred over circuit 24 as circuit 24' has less complex circuitry. Oscillator 18 may be substantially as described above, or as shown for generating oscillator clock phase signals CLK1, CLK2, CLK3 and CLK4 which are respectively the oscillator clock phase signals that clock ring shift registers 30', 32', 34' and 36'. The ring shift registers 30', 32', 34' and 36' in the illustrative embodiment of circuit 24' have one-half as many stages as the corresponding ring shift registers 30, 32, 34 and 36 in circuit 24. Each stage in a ring shift register receives as inputs the respective oscillator clock phase signal and the output of the previous stage of the ring shift register, and provides an output coupled as an input to both the next stage and multiplexer 38'.

Multiplexer 38' is a 16:1 multiplexer that is controlled by four select input bits 40' to select one of the sixteen inputs as output 90. Output 90 provides the clock input to a divide by two counter such as flip flop 92. The output 94 of flip flop 92, and its inverse 96, are coupled as inputs to multiplexer 98. Multiplexer 98 is a 2:1 multiplexer controlled by select input bit 100 to select one of the inputs 94 or 96 as output 42'.

The outputs of each stage of ring shift registers 30', 32', 34' and 36' total sixteen number in the illustrated alternative embodiment and collectively form bus 44' which may be coupled as inputs to other multiplexers. Seven additional 16:1 multiplexers 46', 48', 50', 52', 54', 56' and 58' are shown, each respectively with four select input bits of control 60', 62', 64', 66', 68', 70' and 72' to independently select the respective output 74', 76', 78', 80', 82', 84' and 86' from the sixteen inputs available on bus 44.

The output of each multiplexer, respectively 46', 48', 50', 52', 54', 56' and 58', is coupled to the clock input of a respective flip flop 102, 104, 106, 108, 110, 112 and 114. The flip flop output and inverse are respectively coupled as inputs to multiplexers 116, 118, 120, 122, 124, 126 and 128. Each of these multiplexers is a 2:1 multiplexer that is controlled by a respective select input bit 130, 132, 134, 136, 138, 140 and 142 to select one of the inputs as the respective output 74', 76', 78', 80', 82', 84' and 86'.

Each output of each of the stages of the ring shift registers generates a timing signal that is a phase of the desired or programmed clock signal. The output of each of the thirty two stages of the ring shift registers of circuit 24 are shown as the timing diagrams or desired clock signal phase diagrams in FIG. 4. As will be explained below, the same timing diagrams are also available from circuit 24' illustrated in FIG. 5.

In operation, parameters M and N are user defined based on a FIN and the desired or programmed clock signal frequency, as is known in the art. Clock generating circuit 10 shown in FIG. 1 generates an oscillator clock signal output CLKOUT at frequency FOUT that is a multiple, H, of the desired or programmed clock signal frequency. Divide by H counter 20 generates an output signal, having the same frequency as the desired clock signal, for use by clock generating circuit 20, by dividing down the oscillator clock signal frequency by the multiple.

For example, if the multiple, H, of the oscillator clock signal frequency to desired clock signal frequency is selected as eight, the frequency of the reference clock signal CLKIN is 20 MHz, and the desired clock signal frequency is 100 MHz, then the M/N ratio is five, and the resulting oscillator clock signal frequency is 800 MHz.

Oscillator 18, in the illustrative embodiment, generates a plurality of timing signals that are various phases of the oscillator clock signal. Oscillator 18 generates the oscillator clock signal as a first quadrature oscillator clock phase CLK1; a 90° phase shifted second quadrature oscillator clock phase CLK2; a 180° phase shifted third quadrature oscillator clock phase CLK3; and a 270° phase shifted fourth quadrature oscillator clock phase CLK4. These four oscillator clock phase signals have the same frequency as the oscillator clock signal but are phase shifted as can be seen in FIG. 3.

CLK1 provides the reference signal with the rising leading edge defined as 0° phase shift. The rising leading edge of CLK2 is 90° delayed from CLK1. Similarly, the rising leading edge of CLK3 and CLK4 are respectively 180° and 270° delayed relative to CLK1. In this manner, four quadrature oscillator clock phase signals are generated. Oscillator 18 is shown as a differential, multiple stage oscillator in which each stage has two inputs and two outputs, a signal and its inverse. Using a differential stage oscillator has the advantage of better noise immunity. Since one of the signals is high and the other is low they tend to drift uniformly with the power supply. When four outputs are tapped at equal stage intervals from oscillator 18 having a number of stages that is an integral multiple of four (4, 8, 12, 16 etc.) the outputs will exhibit quadrature. The invention, however, is not limited to operating with oscillator clock phase signals exhibiting quadrature.

On power up, each of the ring shift register stages is preset. Advantage is taken of prior knowledge of the desired clock signal being generated. In a preferred embodiment, the stages of each ring shift register are initialized to have one zero-to-one transition, such as 10000000, 11000000, or 11111110. For example, flip flops zero through 15 of the embodiment illustrated in FIG. 2 are set to one while the remaining flip flops are set to zero. This results in the stages of each of the ring shift registers 30, 32, 34 and 36 set to: 11110000. In addition, the various multiplexer select input bits are set to select one of the inputs as the output. The quadrature oscillator clock phase signals CLK1, CLK2, CLK3 and CLK4 clock respective ones of the stages of ring shift registers 30, 32, 34 and 36. Each time oscillator clock phase signal CLK1 clocks the stages of ring shift register 30, the bits ring shift around ring shift register 30 such that the stage outputs as initially set and after seven sequential clock cycles are: 11110000; 01111000; 00111100; 00011110; 00001111; 10000111; 11000011; and 11100001. On the next subsequent clock input to ring shift register 30 the stage outputs will repeat the initial states.

In the illustrated embodiment, the stages of ring shift register 32 produce the same binary outputs as ring shift register 30 upon being clocked. Due to CLK2 being 90° phase delayed from CLK1, each stage of ring shift register 32 provides the same output as the corresponding stage of ring shift register 30 one-fourth of an oscillator 18 clock cycle later.

Similarly, the stages of ring shift register 34 produce the same binary outputs as ring shift register 30 and 32 upon being clocked. Due to CLK3 being 90° phase delayed from CLK2 and 180° phase delayed from CLK1, the outputs of the corresponding stages of ring shift register 34 are one-fourth of an oscillator 18 clock cycle later than the outputs of ring shift register 32 and one-half of an oscillator 18 clock cycle later than the outputs of ring shift register 30.

Finally, the stages of ring shift register 36 produce the same binary outputs as the corresponding stages of ring shift registers 30, 32 and 34 upon being clocked. Due to CLK4 being 90° phase delayed from CLK3, 180° phase delayed from CLK2, and 270° phase delayed from CLK1, the outputs of corresponding stages of ring shift register 36 are one-fourth of an oscillator 18 clock cycle later than the outputs of ring shift register 34, one-half of an oscillator 18 clock cycle later than the outputs of ring shift register 32, and three-quarters of an oscillator clock cycle later than the outputs of ring shift register 30. Since four quadrature phases of the oscillator clock signal are employed to clock the ring shift registers, and since each ring shift register has eight stages, an effective frequency is generated that is thirty two times the desired clock signal frequency.

Each ring shift register 30, 32, 34 and 36 is a divide by eight ring counter that results in the output of each stage of each ring shift register, and therefore output 42, being at the frequency of the desired clock signal. The output of each of the stages of the ring shift registers generates a timing signal that is a phase of the desired or programmed clock signal. The output of each of the stages of the ring shift registers is coupled to 32:1 multiplexer 38 as an input. In this manner, any of the phases of the desired clock signal, which are outputs of the stages of ring shift registers 30, 32, 34 or 36, are available as output 42 of multiplexer 38 as determined by input select bits 40. Input select bits 40 are five binary digits that control which input to multiplexer 38 is selected as the output. Since each ring counter is a divide by eight counter, the output of any stage of a shift register may provide the divide by eight function 20 shown schematically in FIG. 1. A separate divide by eight counter would be redundant but may be provided.

Figure 4:
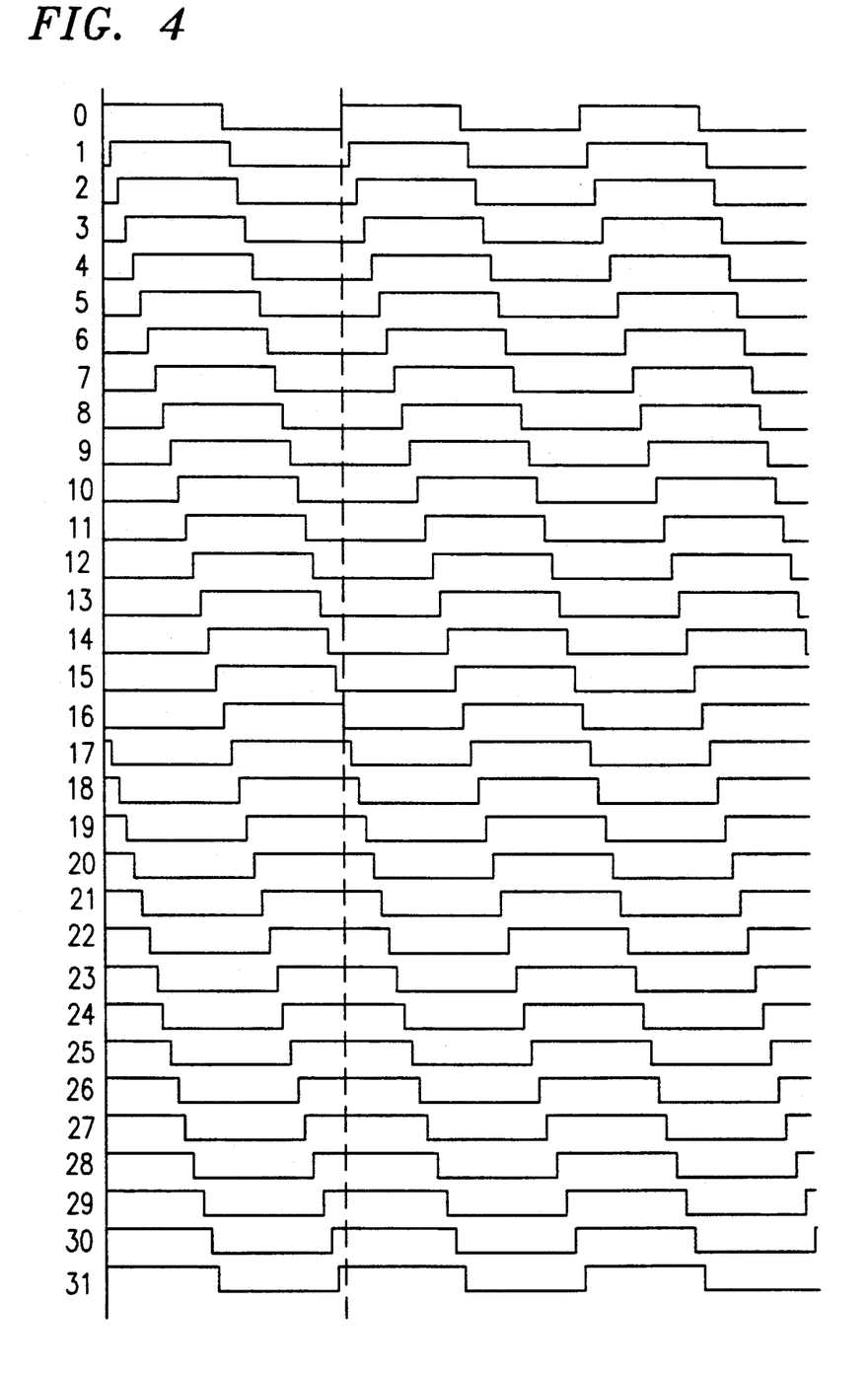
FIG. 4 is a graphical diagram showing the desired clock signal phases generated by the circuit of FIG. 2.

Using four eight-stage ring shift registers, thirty two different phases of the desired clock signal are generated. The thirty two different phases of the desired signal are equally time spaced over the desired clock signal cycle, as can be seen in FIG. 4. Generally, with K equally spaced oscillator clock signal phases (resulting in K ring shift registers, one clocked by each of the K oscillator clock signal phases—four in the illustrated embodiment), the multiple of the oscillator clock signal frequency to the desired clock signal frequency being H (eight in the illustrated embodiment), with effectively L stages in each ring shift register to divide down the oscillator clock signal, the number of phases of the desired clock signal frequency that can be generated are K×L. The phases of the desired clock signal frequency are spaced at intervals of 1/(K×L) of the desired clock signal period.

In the illustrated embodiment, there are thirty two possible desired clock signal phases. Each of the thirty two phases of the desired clock signal is the output of a respective stage of one of the ring shift registers and is shown in FIG. 4. Each of the thirty two phases is designated by a number representing the corresponding flip flop in FIG. 2. The desired clock signal phase defined as the reference phase having no phase shift is designated 0. The other timing signals are evenly spaced across one clock cycle of the reference phase. Since H is also equal to eight in the illustrative embodiment, an output from a stage of a ring shift register may be used in circuit 10.

Collectively the outputs of the ring shift registers 30, 32, 34 and 36, which are the outputs of the respective stages of the ring shift register, are designated bus 44. Bus 44 is illustrated as being coupled to the inputs of additional multiplexers 46, 48, 50, 52, 54, 56 and 58, each of which operates in the same manner as multiplexer 38 and is independently controlled. While seven additional multiplexers are illustrated, making up to seven additional phases of the desired clock signal available as outputs, the invention is not limited thereto. Any number of multiplexers may be provided.

The clock skew adjustment circuit 24' illustrated in FIG. 5 operates in a similar manner. Circuit 24' takes advantage of the symmetry of the desired clock signal being generated and generates the desired clock signal using two levels of count down circuits and two levels of multiplexing. The ring shift registers have only four (L/2) stages. Each ring shift register is initialized to 1100, followed by a 16:1 multiplexer 38'. Multiplexer 38' provides a first level of multiplexing. The output of multiplexer 38' is coupled to the clock input of a divide by two circuit. Both the output signal and the inverse of the output signal from the divide by two circuit are coupled as inputs to 2:1 multiplexer 98 which provides a second level of multiplexing. Select inputs 40' are four bits that control which one of the sixteen outputs from the stages of the ring shift registers is selected as the output of multiplexer 38. Each time the zero-to-one transition shifts around a ring shift register 30', 32', 34' or 36', output 94 and the inverse 96 switch state. Each cycle of 1100 around ring shift registers 30', 32', 34' and 36' generates one-half of the desired clock signal wave form, with two contiguous cycles of 1100 circulating around the ring shift register generating the complete desired clock signal. Select input bit 100 controls which output signal, 94 or 96, is presented at the output 42' of multiplexer 98. In this manner, the effective divide by eight is accomplished by a divide by four followed by a divide by two. The complexity of the programmable clock skew adjustment circuit is substantially reduced. The same thirty two phases of the desired clock signal are generated by circuit 24' as are generated by circuit 24.

The outputs of each stage of ring shift register 30', 32', 34' and 36' form bus 44' which is coupled as inputs to other first level multiplexers 46', 48', 50', 52', 54', 56' and 58'. The outputs of the first level multiplexers drive the clock input of a divide by two flip flop. The output of the flip flop, and its inverse, are coupled to a second level, two to one multiplexer, respectively 116, 118, 120, 122, 124, 126 and 128. The output of the second level multiplexer is controlled by a select input bit to independently select one of the inputs as the output of the multiplexer. Additional divider stages could be added to provide a signal at fractional values of the desired clock signal frequency. For example, an additional divide by two stage would produce a signal at half the frequency of the desired clock signal.

Any one of the phases of the desired clock signals may be selected as the "clock" to drive devices on a circuit board. All of the other phases of the desired clock signal have a known, predetermined, constant timing relationship to the "clock" that may be exploited, such as to overcome propagation delays. This is accomplished by selecting a particular one of the phases of the desired clock signal to clock a device such that the lead time between the chosen phase and the "clock" offsets the propagation delay. In this manner, the clocking function can be customized for each device on a circuit board and for each application. Furthermore, advantage can be taken of the known relationship among the phases of the desired clock signal by selecting a phase to clock a relatively slow device, such as a memory, in advance of the "clock" to provide the memory with additional time prior to occurrence of the clock to set up the data bus for readout.

Figure 6:
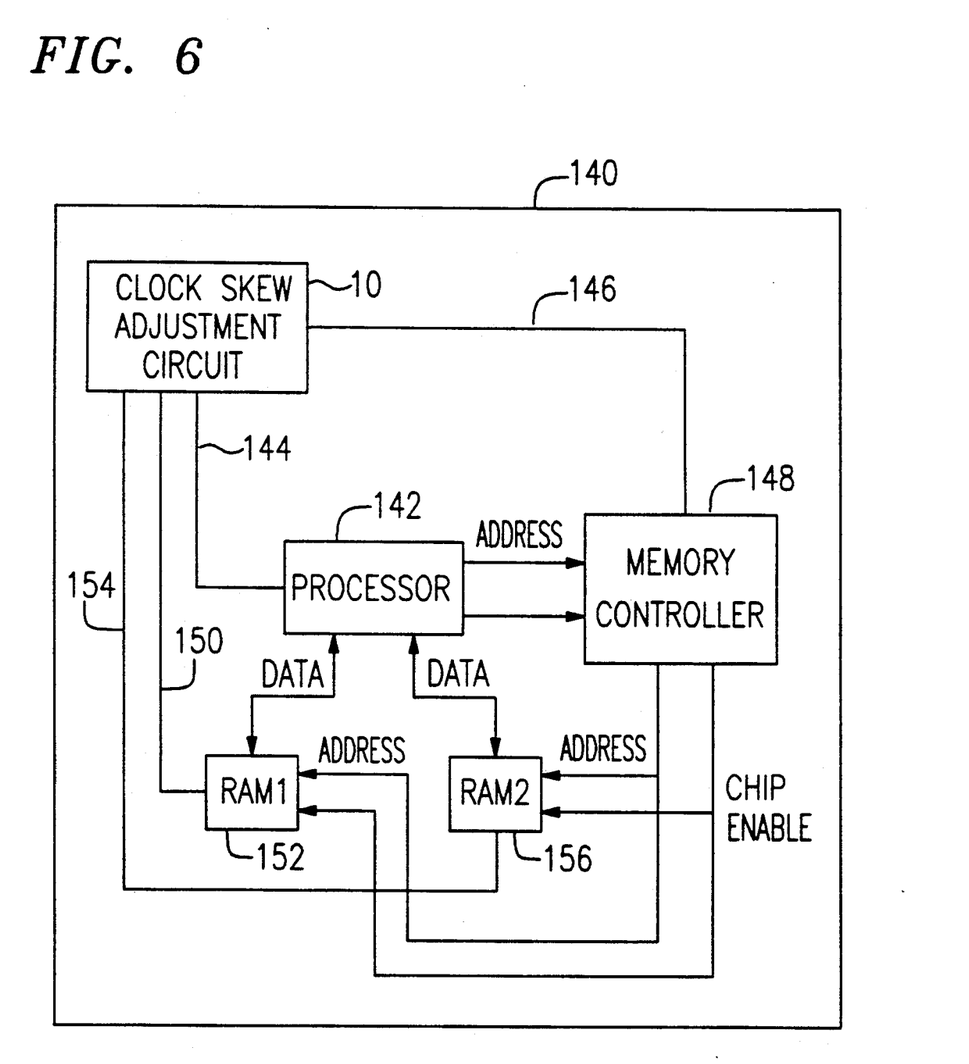
FIG. 6 is a schematic diagram illustrating a clock skew adjustment circuit on a circuit board.

As shown in FIG. 6, clock skew adjustment circuit 10 is schematically shown mounted to a circuit board 140. By way of example, with the desired clock signal phase designated 16 determined to align with the reference clock signal, phase 16 may be provided to processor 142 on trace 144. A desired clock signal phase selected to overcome propagation delays and to take advantage of the known timing relationship to phase 16 to compensate for the speed of a device can be used to clock other devices, such as desired clock signal phase 9 on trace 146 to memory controller 148, desired clock signal phase 1 on trace 150 to a first random access memory 152 and desired clock signal phase 30 on trace 154 to a second random access memory 156.

Those skilled in the art can easily implement the clock skew adjustment circuit in silicon. While the invention has been described as being implemented by an integrated circuit, it is recognized that other embodiments of the invention could be software implemented.

I claim:

1. An integrated circuit, comprising:
   an oscillator for generating a plurality of phases of an oscillator clock signal;
   a plurality of multiple stage ring shift registers, each of said ring shift registers clocked by one of the phases of the oscillator clock signal, each stage of each of said plurality of multiple stage ring shift registers providing an output signal; and
   a multiplexer having a plurality of inputs adapted to receive said output signals, said multiplexer being responsive to a plurality of control signals for selectively providing one of said plurality of output signals at an output of said multiplexer.

2. An integrated circuit as recited in claim 1, wherein the oscillator comprises a number of stages that is a power of two.

3. An integrated circuit as recited in claim 1, wherein the phases of the oscillator clock signal exhibit quadrature.

4. An integrated circuit as recited in claim 1, further comprising a frequency synthesizer.

5. A method for generating phases of a desired clock signal, comprising the steps of:
   generating a plurality of timing signals that are various phases of an oscillator clock signal;
   clocking each stage of a plurality of multiple stage ring shift registers by respective ones of the timing signals; and
   selecting an output from one of the shift register stages as an output signal.

6. A method for generating phases of a desired clock signal as recited in claim 5, further comprising the step of:
   dividing down the output signal to generate a divided output signal.

7. A method for generating phases of a desired clock signal as recited in claim 6, further comprising the steps of:
   inverting the divided output signal to provide an inverted divided output signal; and
   selecting between the divided output signal and the inverted divided output signal as a final output signal.

8. A method for generating phases of a desired clock signal as recited in claim 5, further comprising the step of:

selecting another output from one of the shift register stages as a second output signal.

9. A method for generating phases of a desired clock signal as recited in claim 5, further comprising the step of:

providing the output signal as input to a frequency synthesizer.

10. A clock skew adjustment circuit, comprising:

an oscillator clock phase generating circuit for generating a plurality of timing signals that are various phases of an oscillator clock signal;

a plurality of multiple stage ring shift registers, each of said ring shift registers clocked by one of said timing signals, each stage of each of said plurality of multiple stage ring shift registers providing an output signal; and a multiplexer having a plurality of inputs adapted to receive said output signals, said multiplexer being responsive to a plurality of control signals for selectively providing one of said plurality of input signals as the output of said multiplexer.

11. A clock skew adjustment circuit as recited in claim 10, wherein the timing signals are quadrature phases of the oscillator clock signal.

12. A clock skew adjustment circuit as recited in claim 10, wherein the oscillator clock phase generating circuit comprises a frequency synthesized phase locked loop.

13. A clock skew adjustment circuit as recited in claim 10, wherein the oscillator clock phase generating circuit comprises an oscillator having a plurality of stages.

14. A clock skew adjustment circuit as recited in claim 13, wherein the oscillator comprises a number of stages that is a power of two.

15. A clock skew adjustment circuit as recited in claim 13, wherein the oscillator is current controlled.

16. A clock skew adjustment circuit, comprising:

an oscillator clock phase generating circuit for generating a plurality of timing signals that are various phases of an oscillator clock signal;

a plurality of multiple stage ring shift registers, each of said ring shift registers clocked by one of said timing signals, at least one stage of each of said plurality of multiple stage ring shift registers providing an output signal; and a multiplexer having a plurality of inputs adapted to receive said output signals, said multiplexer being responsive to a control signal for selectively providing one of said input signals as the output of said multiplexer.

17. A clock skew adjustment circuit as recited in claim 16, wherein the timing signals are quadrature phases of the oscillator clock signal.

18. A clock skew adjustment circuit as recited in claim 16, wherein the oscillator clock phase generating circuit comprises a frequency synthesized phase locked loop.

19. A clock skew adjustment circuit as recited in claim 16, wherein the oscillator clock phase generating circuit comprises an oscillator having a plurality of stages.

20. A clock skew adjustment circuit as recited in claim 19, wherein the oscillator comprises a number of stages that is a power of two.

21. A clock skew adjustment circuit as recited in claim 16, further comprising:

a second multiplexer having a plurality of inputs adapted to receive at least a portion of said output signals, said second multiplexer responsive to a control signal for selectively providing one of said plurality of input signals as the output thereof.

22. A clock skew adjustment circuit as recited in claim 16, further comprising:

a divide by two circuit adapted to receive the multiplexer output, the divide by two circuit providing as output signals both a divided down signal and the inverse thereof; and a second multiplexer, the second multiplexer adapted to receive as input signals the divided down signal and the inverse thereof, said second multiplexer being responsive to a control signal for selectively providing one of said input signals as the output thereof.

23. A clock skew adjustment circuit as recited in claim 16, further comprising:

a second multiplexer having a plurality of inputs adapted to receive at least a portion of said output signals, said second multiplexer being responsive to a control signal for selectively providing one of said plurality of input signals as the output thereof;

a divide by two circuit adapted to receive one of said multiplexer outputs, the divide by two circuit providing as output signals both a divided down signal and the inverse thereof; and a third multiplexer, the third multiplexer adapted to receive as input signals the divided down signal and the inverse thereof output from the divide by two circuit, said third multiplexer being responsive to a control signal for selectively providing one of said input signals as the output thereof.

* * * * *